(12) United States Patent
Lee et al.

(10) Patent No.: US 11,927,614 B2
(45) Date of Patent: Mar. 12, 2024

(54) CHAMBER FOR MEASURING PERFORMANCE OF ANTENNA AND SYSTEM INCLUDING SAME

(71) Applicant: Samsung Electronics Co., Ltd., Gyeonggi-do (KR)

(72) Inventors: Youngmin Lee, Gyeonggi-do (KR); Jooseung Kim, Gyeonggi-do (KR); Yongjun An, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 647 days.

(21) Appl. No.: 17/257,998

(22) PCT Filed: Jul. 5, 2019

(86) PCT No.: PCT/KR2019/008281
§ 371 (c)(1),
(2) Date: Jan. 5, 2021

(87) PCT Pub. No.: WO2020/009524
PCT Pub. Date: Jan. 9, 2020

(65) Prior Publication Data
US 2021/0270880 A1 Sep. 2, 2021

(30) Foreign Application Priority Data
Jul. 6, 2018 (KR) .................... 10-2018-0078491

(51) Int. Cl.
*G01R 29/08* (2006.01)
*H01Q 13/02* (2006.01)
(Continued)

(52) U.S. Cl.
CPC ............ *G01R 29/08* (2013.01); *H01Q 13/02* (2013.01); *H01Q 15/02* (2013.01); *H01Q 15/16* (2013.01); *H01Q 15/23* (2013.01)

(58) Field of Classification Search
CPC ..... G01R 31/2822; G01R 29/10; G01R 31/28; H01Q 15/02; H01Q 1/526; H01Q 19/06; H01Q 3/14
See application file for complete search history.

(56) References Cited

U.S. PATENT DOCUMENTS 6,008,753 A 12/1999 Berg et al.
7,280,077 B2 10/2007 Woo et al.
(Continued)

FOREIGN PATENT DOCUMENTS

CN 110045189 A * 7/2019 ............ G01R 29/08
JP 10284930 10/1998
(Continued)

OTHER PUBLICATIONS

Transceiver antenna for radar of vehicle has rotary drive unit which rotates dielectric lens about axis other than its central axis. Nishiyama et al. (Year: 1998).*
(Continued)

*Primary Examiner* — Vibol Tan
(74) *Attorney, Agent, or Firm* — The Farrell Law Firm, P.C.

(57) ABSTRACT

According to various embodiments of the disclosure, disclosed is an antenna chamber which includes a mounting part to receive an external electronic device including an antenna module including a plurality of radiators to radiate a millimeter wave signal, a lens spaced apart from the mounting part to refract the millimeter wave signal radiated from the antenna module, an antenna spaced apart from the lens in a direction opposite to a direction of the mounting part to receive the millimeter wave signal refracted from the lens, and a lens driving unit to move the lens based at least on a first direction, which is set, such that the millimeter wave signal set to be radiated in the first direction from an external electronic device is refracted toward the antenna.

(Continued)

Moreover, various embodiments found through the disclosure are possible.

13 Claims, 18 Drawing Sheets

(51) Int. Cl.
    *H01Q 15/02*     (2006.01)
    *H01Q 15/16*     (2006.01)
    *H01Q 15/23*     (2006.01)

(56) References Cited

U.S. PATENT DOCUMENTS

| | | | |
|---|---|---|---|
| 10,116,114 B2 | 10/2018 | Kermene et al. | |
| 10,483,636 B1 * | 11/2019 | Koto | H04B 17/20 |
| 10,536,226 B1 * | 1/2020 | Huynh | H04B 17/16 |
| 11,362,434 B2 | 6/2022 | Yun et al. | |
| 11,525,853 B2 * | 12/2022 | Kobayashi | G05D 23/19 |
| 2006/0057985 A1 | 3/2006 | Woo et al. | |
| 2017/0324213 A1 | 11/2017 | Kermene et al. | |
| 2018/0006745 A1 | 1/2018 | Vanwiggeren | |
| 2019/0036621 A1 | 1/2019 | Vanwiggeren | |

FOREIGN PATENT DOCUMENTS

| | | | |
|---|---|---|---|
| JP | 2006166399 | | 6/2006 |
| JP | 2007187642 | | 7/2007 |
| JP | 2008153475 | A * | 7/2008 |
| JP | 2012222545 | | 11/2012 |
| KR | 1020040055671 | | 6/2004 |
| KR | 1020060023246 | | 3/2006 |
| KR | 101045845 | | 7/2011 |
| KR | 101051964 | | 7/2011 |
| KR | 101467171 | | 12/2014 |
| KR | 1020190060283 | | 6/2019 |

OTHER PUBLICATIONS

Portable Radar Measuring Device Using Microwave Lens. Han Seok Choo et al. (Year: 2011).*
PCT/KR2019/008281—English Translation (Year: 2019).*
PCT/ISA/210 Search Report issued on PCT/KR2019/008281, dated Oct. 28, 2019, pp. 5.
PCT/ISA/237 Written Opinion issued on PCT/KR2019/008281, dated Oct. 28, 2019, pp. 6.
Korean Office Action dated Jul. 20, 2023 issued in counterpart application No. 10-2018-0078491, 11 pages.

* cited by examiner

CHAMBER FOR MEASURING PERFORMANCE OF ANTENNA AND SYSTEM INCLUDING SAME

PRIORITY

This application is a National Phase Entry of PCT International Application No. PCT/KR2019/008281 which was filed on Jul. 5, 2019, and claims priority to Korean Patent Application No. 10-2018-0078491, which was filed on Jul. 6, 2018, the entire contents of each of which is incorporated herein by reference.

TECHNICAL FIELD

Various embodiments of the disclosure relate to a chamber for measuring the performance of an antenna and a system including the same.

BACKGROUND ART

Recently, various types of electronic devices, such as a smartphone, and a tablet personal computer (PC), have been extensively spread with the development of an information technology. The electronic device may wirelessly make communication with another electronic device or a base station using an antenna.

Recently, a $5^{th}$ generation (5G) technology has been developed using a signal in an ultra-high frequency band as network traffic is rapidly increased by mobile devices. When the signal in the ultra-high frequency band is used, the wavelength of the signal may be shortened to be in the unit of millimeter, and a wider bandwidth of the signal may allow a larger amount of information to be transmitted or received.

The signal in the ultra-high frequency band has strong straightness. Accordingly, an antenna technology, that is, a beamforming technology to change a beam direction for transmitting or receiving the signal is necessary to make communication with electronic devices or base stations positioned in various directions. In the beamforming technology, it is important for the electronic device to form a beam exactly orienting in a set direction and to maintain the performance of an antenna to be in a specified level in the set direction.

DISCLOSURE

Technical Problem

As described above, an antenna chamber may be used to measure the antenna performance, for example, beamforming performance of the electronic device. The antenna chamber, which is a small chamber surrounded by walls having an anti-reflective property, may include an antenna to measure a signal radiated from Equipment Under Test (EUT) disposed therein.

To test whether the electronic device may exactly form the beam in the set direction, there may be a manner to place a plurality of antennas inside the chamber or a manner to physically change the direction of the electronic device. The former may cause a cost issue resulting from the increase in the number of antennas to test in various directions, and may cause a spatial issue resulting from the increase in the size of a chamber. The later may cause the damage to an outer appearance of the electronic device or the distortion in antenna performance, by a device to fix the electronic device.

Various embodiments disclosed in the disclosure are to provide an electronic device to solve the above problems and to resolve the issues raised herein

Technical Solution

According to an embodiment of the disclosure, an antenna chamber may include a mounting part to receive an external electronic device including an antenna module including a plurality of radiators to radiate a millimeter wave signal, a lens spaced apart from the mounting part to refract the millimeter wave signal radiated from the antenna module, an antenna spaced apart from the lens in a direction opposite to a direction of the mounting part to receive the millimeter wave signal refracted from the lens, and a lens driving unit to move the lens based at least on a first direction, which is set, such that the millimeter wave signal set to be radiated in the first direction from an external electronic device is refracted toward the antenna.

According to an embodiment of the disclosure, a system for measuring antenna performance may include an antenna chamber including a mounting part to dispose an external electronic device (equipment under test), which radiates a millimeter wave signal using an antenna module including a plurality of radiators, an antenna to receive the millimeter wave signal, a lens interposed between the mounting part and the antenna to refract the millimeter wave signal, and a lens driving unit to seat the lens on the lens driving unit and to rotate the lens at a specified angle, and at least one electronic device electrically connected with the external electronic device or the antenna chamber. The at least one electronic device may control the external electronic device to radiate the millimeter wave signal in a first direction, control the lens driving unit to rotate the lens based at least on the first direction such that the millimeter wave signal set to be radiated in the first direction faces the antenna, and measure an intensity of a millimeter wave signal received in the antenna.

Further, according to an embodiment of the disclosure, a method for measuring antenna performance of an external electronic device including an antenna module including a plurality of radiators, may include controlling the external electronic device to radiate a millimeter wave signal in a first direction, rotating a lens based on the first direction such that the millimeter wave signal faces an antenna, and measuring an intensity of the millimeter wave signal received in the antenna.

Advantageous Effects

According to various embodiments of the disclosure, antenna performance, that is, beamforming performance of the target device may be measured only by using one antenna. Accordingly, the size of the chamber may be reduced and design costs may be saved. In addition, in testing of performance, the damage to the outer appearance of the target device and the distortion in the antenna performance may be minimized. Besides, a variety of effects directly or indirectly understood through the disclosure may be provided.

DESCRIPTION OF DRAWINGS

In the following description made with respect to the accompanying drawings, similar components will be assigned with similar reference numerals.

MODE FOR INVENTION

Figure 1:
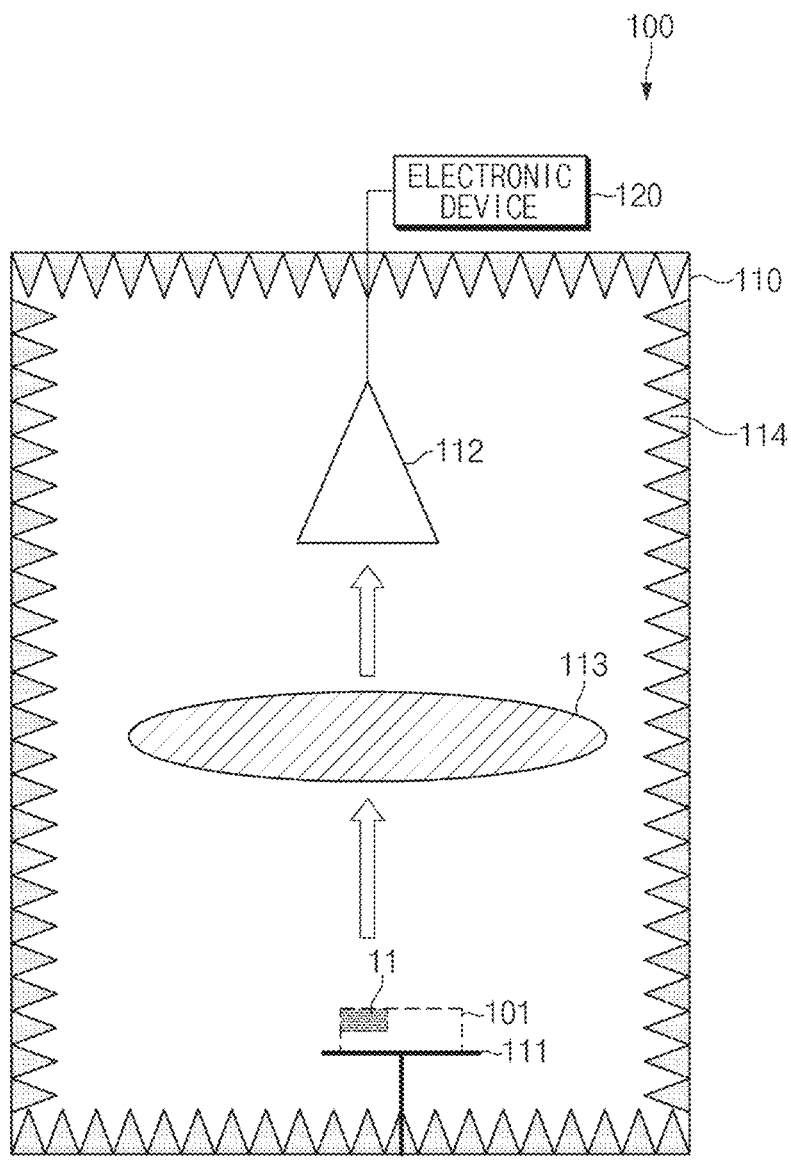
FIG. 1 illustrates a system for measuring antenna performance, according to an embodiment.

FIG. 1 illustrates a system 100 for measuring antenna performance, according to an embodiment. Referring to FIG. 1, the system 100 for measuring the antenna performance may include an antenna chamber 110 and an electronic device 120 (e.g., an electronic device 801 of FIG. 8). According to an embodiment, the antenna chamber 110 and the electronic device 120 may be electrically connected with each other. For example, the electronic device 120 may be electrically connected to an antenna 112 included in the antenna chamber 110. The electronic device 120 may receive a signal detected by the antenna 112 or transmit a specified signal through the antenna 112.

According to various embodiments, at least one electronic device 120 may be provided. For example, the electronic device 120 may include a control device to control at least one component in the antenna chamber 110 and a measuring device to measure the intensity of a signal detected in the antenna chamber 110. For another example, the electronic device 120 may be a single electronic device which performs both functions of the control device and the measuring device.

The antenna chamber 110 may include a mounting part 111 to mount equipment-under-test (EUT) 101 (e.g., the electronic device 801 of FIG. 8), a lens 113, and the antenna 112. According to an embodiment, the antenna chamber 110 may be surrounded by wall surfaces 114 having an anti-reflective property. Accordingly, an electromagnetic signal, such as a millimeter wave signal, radiated from the EUT 101 may not be reflected when arriving at the wall surface 114 of the antenna chamber 110. For example, the millimeter wave signal may be absorbed into the wall surface 114 when arriving at the wall surface 114 of the antenna chamber 110. In the disclosure, the EUT 101 may be referred to as an external electronic device 101.

According to an embodiment, the external electronic device 101 may be set to emit a millimeter wave signal in a specified direction. For example, the external electronic device 101 may radiate the millimeter wave signal in the specified direction through a beamforming technology of forming a beam in the specified direction. For example, the external electronic device 101 may include an antenna module including a plurality of radiators. Each of the plurality of radiators may radiate a specified signal, and a phase of the signal radiated from each radiator may be changed by a phase shifter (PS) electrically connected with the respective radiator. A phase difference may be made between signals radiated from the radiators, and the antenna module may form the beam in the specified direction based on the phase difference.

According to an embodiment, when the external electronic device 101 radiates a millimeter wave signal in a preset direction, the lens 113 may be controlled to refract the millimeter wave signal toward the antenna 112 based on the set direction. The antenna 112 may detect the millimeter wave signal refracted by the lens 113.

According to an embodiment, when the external electronic device 101 radiates the millimeter wave signal to be oriented in the preset direction, the intensity of the millimeter wave signal detected by the antenna 112 may be in a specified level or more. According to another embodiment, when the external electronic device 101 radiates a millimeter wave signal in a direction different from the preset direction, the intensity of the millimeter wave signal sensed by the antenna 112 may be in less than the specified level.

In this specification, the millimeter wave signal may be understood as an electromagnetic wave having a wavelength in the unit of millimeter. The millimeter wave signal may have a frequency, for example, ranging from 20 GHZ to 100 GHZ, and may have strong straightness. In addition, in this specification, the external electronic device 101 may be understood as an electronic device (e.g., the electronic device 801 of FIG. 8) to make communication using the millimeter wave signal. The external electronic device 101 may include an antenna area 11 in which an antenna module is disposed. The antenna area 11 may be understood as an area in which the millimeter wave signal is discharged from the external electronic device 101 toward the lens 113.

In this specification, a component having the same reference numeral as that of the system 100 for measuring the antenna performance illustrated in FIG. 1 may be applied with the same description as that of FIG. 1.

Figure 2A:
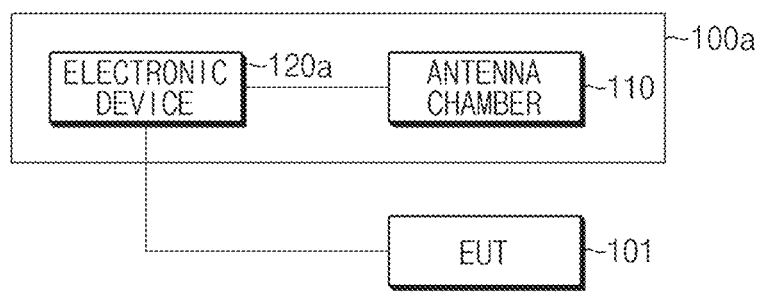
FIG. 2A illustrates a block diagram of a system for measuring antenna performance, according to an embodiment.
Figure 2B:
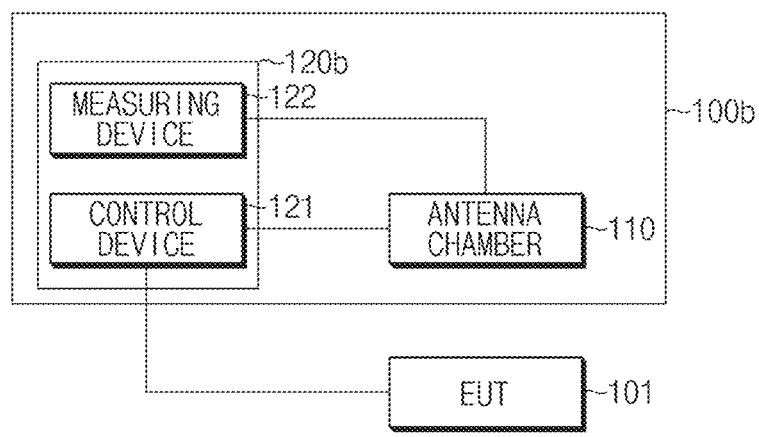
FIG. 2B illustrates a block diagram of a system for measuring antenna performance, according to another embodiment.

FIG. 2A illustrates a block diagram of a system 100a for measuring antenna performance, according to an embodiment. FIG. 2B illustrates a block diagram of a system 100b for measuring antenna performance, according to another embodiment.

Referring to FIG. 2A, the system 100a for measuring the antenna performance (e.g., the system 100 for measuring the antenna performance of FIG. 1) may include the antenna chamber 110 and an electronic device 120a (e.g., the electronic device 120 of FIG. 1). According to an embodiment, the electronic device 120a may be one electronic device, for example, a measuring device as illustrated in FIG. 2A. According to an embodiment, the external electronic device 101 is a EUT, which may be not included in the system 100a for measuring the antenna performance as illustrated in FIG. 2A. However, according to an embodiment, a position in which the external electronic device 101 is actually placed may be an inside of the antenna chamber 110 included in the system 100a for measuring the antenna performance, which is identical to or similar to that illustrated in FIG. 1.

According to an embodiment, the system 100a for measuring the antenna performance may be electrically connected with the external electronic device 101. For example, the electronic device 120a may make communication with the external electronic device 101 wiredly or wirelessly. Accordingly, the electronic device 120a may control some of functions of the external electronic device 101, and may receive, from the external electronic device 101, information associated with the external electronic device 101, for example, information on a direction in which the external electronic device 101 radiates a millimeter wave signal, or information on a period in which the external electronic device 101 changes the direction.

The antenna chamber 110 may be a space configured to detect a millimeter wave signal radiated by the external electronic device 101. For example, the antenna chamber 110 may include an antenna (e.g., the antenna 112 of FIG. 1), and the antenna may detect the millimeter wave signal radiated from the external electronic device 101 placed inside the antenna chamber 110. According to various embodiments, the antenna chamber 110 may be configured to detect or receive the millimeter wave signal even if the direction of the millimeter wave signal radiated from the external electronic device 101 is changed. For example, a lens (e.g., the lens 113 of FIG. 1) or a reflecting plate (e.g., a reflecting plate 415 of FIG. 4A) included in the antenna chamber 110 may be controlled to refract or reflect the millimeter wave signal toward the antenna.

The electronic device 120a may be electrically connected with the antenna chamber 110 or the external electronic device 101. According to an embodiment, the electronic device 120a may make communication with the antenna chamber 110 or the external electronic device 101 wiredly or wirelessly, and may control the antenna chamber 110 or the external electronic device 101. For example, the electronic device 120a may control the external electronic device 101 such that a millimeter wave signal is radiated from the external electronic device 101 in a first direction. For another example, the electronic device 120a may control a lens or a reflecting plate included in the antenna chamber 110 such that the millimeter wave signal is refracted or reflected toward the antenna. For another example, the electronic device 120a may change the direction, for example, the first direction, in which the millimeter wave signal is radiated from the external electronic device 101 at a specified time interval, and may control the lens or reflecting plate based on the first direction that is changed.

According to an embodiment, the electronic device 120a may receive specified information from the antenna chamber 110 or the external electronic device 101. For example, the electronic device 120a may receive a millimeter wave signal detected by the antenna in the antenna chamber 110 and may measure the intensity of the received millimeter wave signal. For another example, the electronic device 120a may receive information associated a direction set to radiate a millimeter wave signal from the external electronic device 101. In this case, the electronic device 120a may transmit the received information to the antenna chamber 110 and control a lens or a reflecting plate based on the received information.

Referring to FIG. 2B, an electronic device 120b (e.g., the electronic device 120 of FIG. 1) may include at least one electronic device, which differs from that illustrated in FIG. 2A. For example, the electronic device 120b may include a control device 121 and a measuring device 122 as shown in FIG. 2B. In an embodiment, the control device 121 may be a device to perform a communication function or a processing function, and the measuring device 122 may be a device to perform a measurement function for the received signal.

According to an embodiment, the control device 121 may be electrically connected with the antenna chamber 110 or the external electronic device 101. In an embodiment, the control device 121 may transmit a first signal to the external electronic device 101 such that the millimeter wave signal is radiated in the first direction from the external electronic device 101. The external electronic device 101 may emit a millimeter wave signal in the first direction based on the received first signal. In an embodiment, the control device 121 may transmit a second signal to the antenna chamber 110 to control the lens or the reflecting plate included in the antenna chamber 110. The antenna chamber 110 may control the lens or the reflecting plate such that the millimeter wave signal is refracted or reflected toward the antenna based on the received second signal.

Figure 3A:
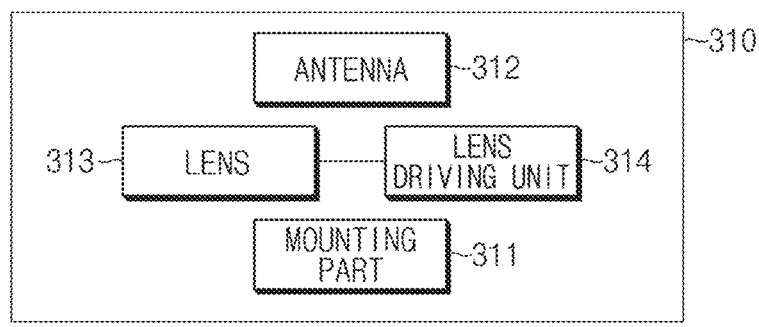
FIG. 3A is a block diagram of the antenna chamber, according to an embodiment.
Figure 3B:
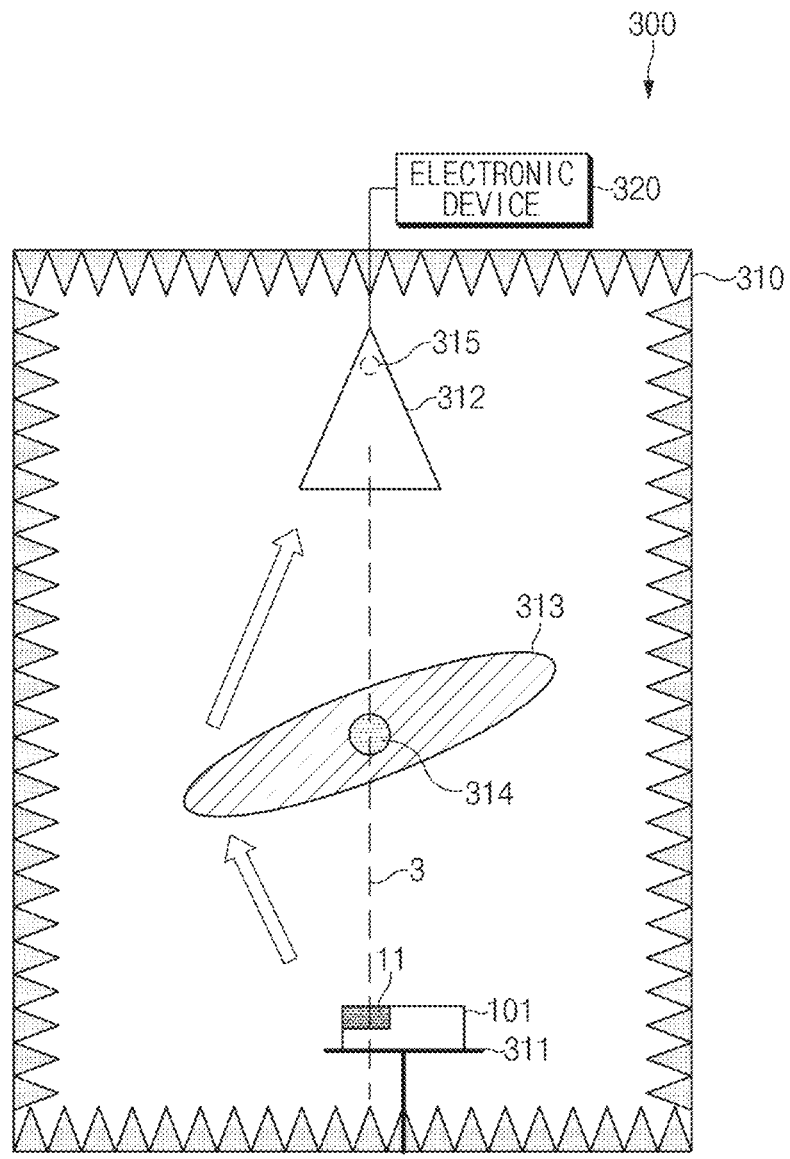
FIG. 3B illustrates a system for measuring antenna performance, which includes an antenna chamber, according to an embodiment.
Figure 3C:
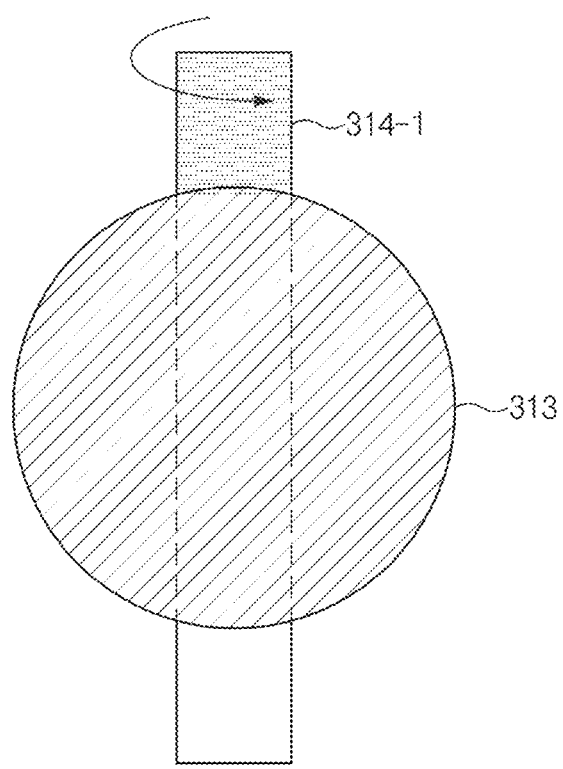
FIG. 3C illustrates a lens and a lens driving unit included in an antenna chamber, according to an embodiment.
Figure 3D:
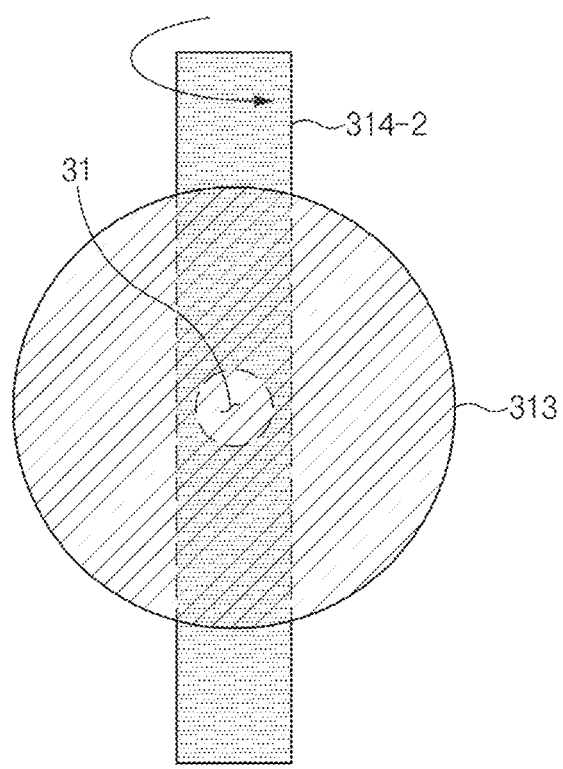
FIG. 3D illustrates a lens and a lens driving unit included in an antenna chamber, according to another embodiment.

In this specification, a component having the same reference numeral as those of the system 100a for measuring the antenna performance illustrated in FIG. 2A and the system 100b for measuring the antenna performance illustrated in FIG. 2B may be applied with the same description as those of FIGS. 2A and 2B FIG. 3A is a block diagram of an antenna chamber 310 according to an exemplary embodiment. FIG. 3B illustrates a system for measuring antenna performance, which includes an antenna chamber, according to an embodiment. FIG. 3C illustrates a lens and a lens driving unit included in an antenna chamber, according to an embodiment. FIG. 3D illustrates a lens and a lens driving unit included in an antenna chamber, according to another embodiment.

Referring to FIG. 3A, the antenna chamber 310 (e.g., the antenna chamber 110 of FIG. 2A or 2B) may include a mounting part 311, an antenna 312, a lens 313, and a lens driving unit 314. According to various embodiments, the antenna chamber 310 may additionally include a component not illustrated in FIG. 3A, and may not include some of components illustrated in FIG. 3A. For example, the antenna chamber 310 may further include an additional communication module to make communication with an external device, or may further include a process or memory.

The mounting part 311 may be an area in which the external electronic device 101 radiating a millimeter wave signal is placed. According to an embodiment, the mounting part 311 may include a device to fix the external electronic device 101 such that the external electronic device 101 is not moved.

The antenna 312 may detect and receive a millimeter wave signal radiated from the external electronic device 101. According to an embodiment, the antenna 312 may be a horn antenna. For example, the horn antenna may be disposed to face the mounting part 311.

The lens 313 is interposed between the mounting part 311 and the antenna 312 and may refract a millimeter wave signal radiated from the external electronic device 101 at a specified angle. According to various embodiments, the material of the lens 313 may include, for example, polytetrafluoroethylene (PTFE; Teflon).

According to various embodiments, although opposite surfaces of the lens 313 may be symmetrical to each other as illustrated in FIG. 3B, the opposite surfaces of the lens 313 may be asymmetrical differently from that of illustrated in FIG. 3B. For example, a first surface, which faces the mounting part 311, of the opposite surfaces of the lens 313, may be a spherical surface, and a second surface, which faces the antenna 312, of the opposite surfaces of the lens 313 may be an aspherical surface. For another example, the first surface may be an aspherical surface, and the second surface may be a spherical surface. For another example, the first and second surfaces are spherical surfaces, and a radius of curvature of the first surface and a radius of curvature of the second surface may be different from each other.

According to various embodiments, the size of the lens 313 and a position at which the lens 313 is disposed may be variously set. For example, the size of the lens 313 and the position at which the lens 313 is disposed may be set in consideration of a maximum value of an angle at which a millimeter wave signal is radiated from the external electronic device 101. As the size of the lens 313 increases or the distance between the lens 313 and the mounting part 311 is shorter, the antenna performance of the external electronic device 101 showing a larger maximum value of the angle may be measured.

The lens driving unit 314 may drive the lens 313 such that the angle of the lens 313 is adjusted. According to an embodiment, the lens 313 may be seated on the lens driving unit 314. The lens driving unit 314 may adjust the angle of the lens 313 by rotating the seated lens 313 that is seated.

According to an embodiment, the lens driving unit 314 may adjust the angle of the lens 313 such that the millimeter wave signal radiated from the external electronic device 101 is oriented toward the antenna 312. For example, the external electronic device 101 may be configured to radiate a millimeter wave signal in the first direction. In various embodiments, the first direction may be set by the external electronic device 101 or the electronic device (e.g., the electronic device 120 of FIG. 1). When the first direction is set by the electronic device, the external electronic device 101 may receive information on the first direction through communication with the electronic device.

According to an embodiment, the lens driving unit 314 may adjust the angle of the lens 313 based on the first direction, which is set, regardless of the direction in which the millimeter wave signal is radiated from the external electronic device 101. For example, the lens driving unit 314 may adjust the angle of the lens 313 such that the millimeter wave signal is refracted toward the antenna 312 on the assumption that the millimeter wave signal is exactly incident in the first direction, which is set, from the external electronic device 101.

According to an embodiment, the antenna chamber 310 may further include an antenna driving unit not illustrated in FIG. 3A. The antenna driving unit may adjust a direction of the antenna 312, for example, a direction in which a horn antenna faces. According to an embodiment, the antenna driving unit may adjust the direction of the antenna 312 based on the angle of the lens 313 changed by the lens driving unit 314. For example, the antenna driving unit may adjust the direction of the antenna 312 to the direction of the refracted millimeter wave signal to increase the detection rate of the antenna 312 for the millimeter wave signal refracted by the lens 313.

Referring to FIG. 3B, the antenna chamber 310 illustrated in FIG. 3A may constitute a system 300 for measuring antenna performance together with an electronic device 320. The electronic device 320 may be, for example, the electronic device 120a illustrated in FIG. 2A or may include the control device 121 and the measuring device 122 illustrated in FIG. 2B.

According to an embodiment, the external electronic device 101 may be disposed on the mounting part 311. In an embodiment, the external electronic device 101 may be disposed such that an antenna area 11 from which the millimeter wave signal is radiated is positioned on the central axis of the lens 313. For example, the external electronic device 101 may be disposed such that the area 11, from which the millimeter wave signal is radiated, is positioned on a virtual extension line 3 linking the center of the antenna 312 to the center of the lens 313.

According to an embodiment, the electronic device 320 (e.g., the electronic device 120 of FIG. 2A or the control device 121 of FIG. 2B) is electrically connected with some of the components in the antenna chamber 310 to control the components. For example, the electronic device 320 may control the lens driving unit 314 or the lens 313 by making communication with the lens driving unit 314 wiredly or wirelessly.

According to an embodiment, the electronic device 320 may transmit a specified signal to the lens driving unit 314. In an embodiment, the specified signal may include information on the first direction set for radiation of a millimeter wave signal from the external electronic device 101 or information on an angle of the lens 313 determined based on the information on the first direction. According to another embodiment, the specified signal may include information for changing the angle of the lens 313 at a specified time interval. The lens driving unit 314 may change the angle of the lens 313 based on the received signal.

According to another embodiment, when the antenna chamber 310 includes an antenna driving unit 315 to control the antenna 312, the electronic device 320 may transmit a specified signal to the antenna driving unit 315. In an embodiment, the specified signal may include information on the first direction set for radiation of a millimeter wave signal from the external electronic device 101 or information on an angle of the lens 313 based on the first direction, or may be generated based on the information. According to another embodiment, the specified signal may include information for changing the angle of the lens 313 or the millimeter wave signal, at a specified time interval. The antenna driving unit 315 may change the angle of the antenna 312 based on the received signal According to an embodiment, the electronic device 320 (e.g., the electronic device 120a of FIG. 2A or the measuring device 122 of FIG. 2B) may be electrically connected with the antenna 312 included in the antenna chamber 310 and may measure the intensity of the millimeter wave signal detected or received by the antenna 312. According to an embodiment, the millimeter wave signal detected or received by the antenna 312 may be a fine signal, so the electronic device 320 may amplify the millimeter wave signal received by the antenna 312 and may measure the intensity of the amplified millimeter wave signal. In this case, the electronic device 320 may include at least one amplifier.

According to an embodiment, the electronic device 320 may determine the antenna performance of the external electronic device 101 based on the measured intensity of the millimeter wave signal. For example, when the measured intensity is in the specified level or more, the beamforming performance of the external electronic device 101 may be determined as being in the specified level or more. For example, when the measured intensity is in less than the specified level, the beamforming performance of the external electronic device 101 may be determined as being in less than the specified level.

FIG. 3C illustrates the lens 313 and the lens driving unit 314 when viewed from a position of the antenna 312 of FIG. 3B toward the lens 313. According to an embodiment, the lens driving unit 314 may include at least one adjusting rod 314-1, and the at least one adjusting rod 314-1 may pass through the lens 313 as illustrated in FIG. 3C. According to various embodiments, the at least one adjusting rod 314-1 may be attached to an upper portion or a lower portion of the lens 313. According to an embodiment, the lens driving unit 314 may adjust the angle of the lens 313 by rotating the at least one adjusting bar 314-1.

FIG. 3D illustrates the lens 313 and the lens driving unit 314 when viewed from a position of the antenna 312 of FIG. 3B toward the lens 313, according to another embodiment. According to an embodiment, an adjusting rod 314-2 may have a hole 31 formed in at least a portion thereof, which differs from the adjusting rod 314-1 illustrated in FIG. 3C. According to an embodiment, the adjusting rod 314-2 may pass through the lens 313 such that the hole 31 is positioned at a point including the center of the lens 313. Accordingly, the external electronic device 101 may radiate a millimeter wave signal toward the center of the lens 313.

In this specification, a component having the same reference numeral as that of the system 300 for measuring the antenna performance illustrated in FIGS. 3A to 3D may be applied with the same description as those of FIGS. 3A to 3D.

Figure 4A:
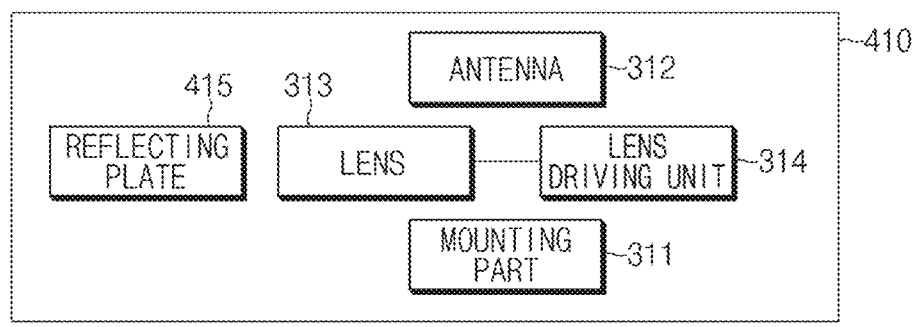
FIG. 4A illustrates a block diagram of an antenna chamber, according to another embodiment.
Figure 4B:
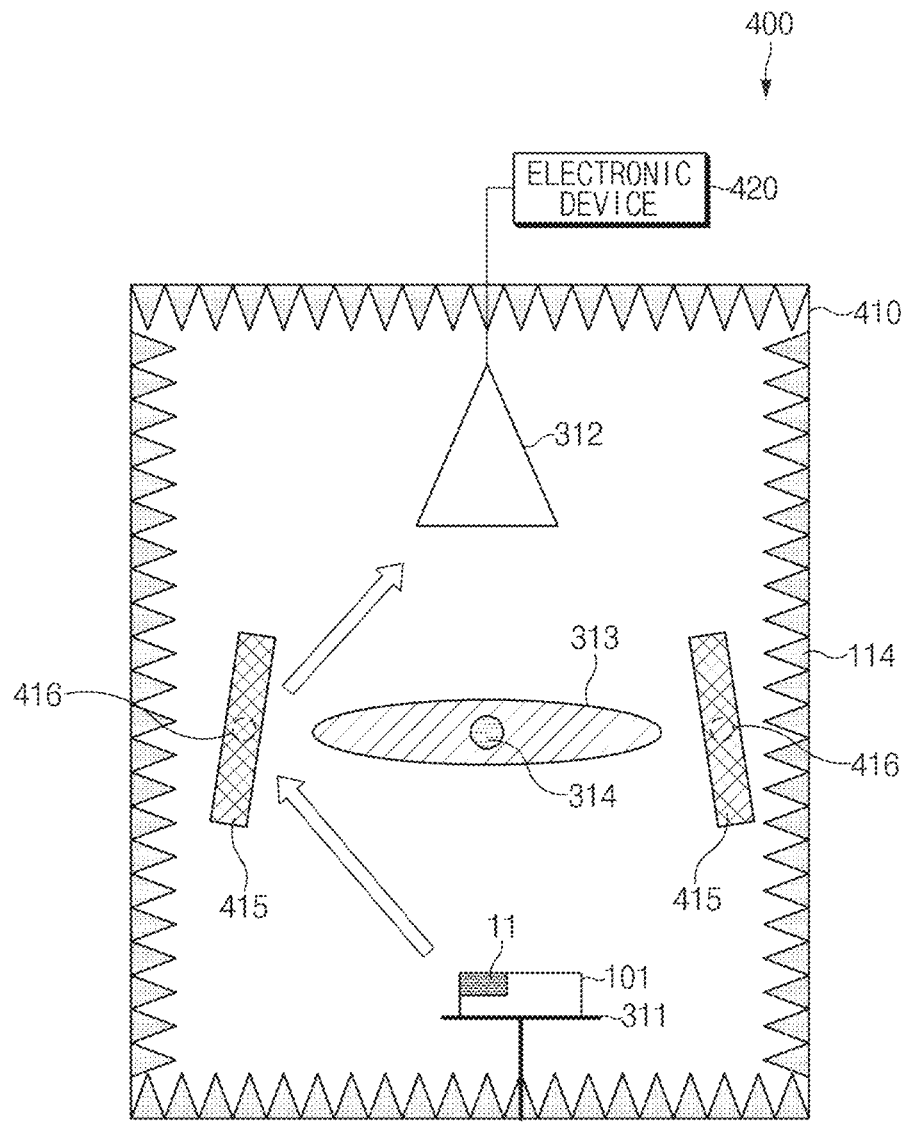
FIG. 4B illustrates a system for measuring antenna performance, which includes an antenna chamber, according to another embodiment.

FIG. 4A illustrates a block diagram of an antenna chamber, according to another embodiment. FIG. 4B illustrates a system for measuring antenna performance, which includes an antenna chamber, according to another embodiment.

Referring to FIG. 4A, an antenna chamber 410 (e.g., the antenna chamber 110 of FIG. 2A or 2B) may include the mounting part 311, the antenna 312, the lens 313, the lens driving unit 314, and the reflecting plate 415. According to various embodiments, the antenna chamber 410 may additionally include a component not illustrated in FIG. 4A, and may not include some of components illustrated in FIG. 4A. In the following description made with reference to FIG. 4A, the same as or similar to those of the description made with reference to FIG. 3A will be omitted to avoid redundancy.

The reflecting plate 415 may be interposed between the mounting part 311 and the antenna 312, and may reflect a millimeter wave signal radiated from the external electronic device 101 toward the antenna 312. According to an embodiment, at least one reflecting plate 415 may be provided. For example, reflecting plates 415 may be disposed one by one at opposite sides of the lens 313 as illustrated in FIG. 4B.

According to various embodiments, the material of the reflecting plate 415 may include polytetrafluoroethylene (PTFE; Teflon) or Plexiglas.

According to an embodiment, the antenna chamber 410 may further include a reflecting plate driving unit 416 to adjust the position or angle of the reflecting plate 415, which differs from that of FIG. 4A. The reflecting plate driving unit 416 may change the position or angle of the reflecting plate 415 based on the direction of the millimeter wave signal radiated from the external electronic device 101. For example, when the radiation direction of the millimeter wave signal is further away from the lens 313, the reflecting plate driving unit 416 may adjust the position of the reflecting plate 415 to be further away from the lens 313. The reflecting plate driving unit 416 may adjust the angle of the reflecting plate 415 such that the millimeter wave signal is radiated toward the antenna 312, as the position of the reflecting plate 415 is changed.

According to an embodiment, the reflecting plate 415 may be disposed outside the lens 313. Accordingly, the antenna chamber 410 may measure the antenna performance of the external electronic device 101 in a wider range. For example, even if the direction of the millimeter wave signal, which is radiated from the external electronic device 101 toward the antenna 312 through the lens 313, is out of a tolerance range for a direction change, the millimeter wave signal may be reflected by the reflecting plate 415 and detected by the antenna 312.

Referring to FIG. 4B, the antenna chamber 410 illustrated in FIG. 4A may constitute a system 400 for measuring antenna performance, together with an electronic device 420. The electronic device 420 may be, for example, the electronic device 120a illustrated in FIG. 2A or may include the control device 121 and the measuring device 122 illustrated in FIG. 2B. In the following description made with reference to FIG. 4B, the same as or similar to those of the description made with reference to FIG. 3B will be omitted to avoid redundancy.

According to an embodiment, the electronic device 420 may control the lens driving unit 314 to prevent the angle of the lens 313 from being changed, when the direction of the millimeter wave signal radiated from the external electronic device 101 toward the antenna 312 through the lens 313, is out of the tolerance range for the direction change, for example, the range in which the millimeter wave signal linearly arrives at the lens from the external electronic device 101. For example, when the direction of the millimeter wave signal radiated from the external electronic device 101 is determined as being out of the range of the lens 313, the electronic device 420 may transmit a specified signal to the lens driving unit 314. According to an embodiment, the lens driving unit 314 may control the lens 313 based on the specified signal, thereby preventing the angle of the lens 313 from being changed. According to another embodiment, the lens driving unit 314 may control the lens 313 based on the specified signal, such that the lens 313 is in a basic state, for example, is not inclined.

According to an embodiment, when the antenna chamber 410 further includes the reflecting plate driving unit 416, the electronic device 420 may make communication with the reflecting plate driving unit 416 wiredly or wirelessly and may transmit the specified signal to the reflecting plate driving unit 416. In an embodiment, the specified signal may include information on the direction set for radiation of a millimeter wave signal from the external electronic device 101, information on the angle of the reflecting plate 415 or information on a position of the reflecting plate 415, based on the information on the direction, or may be generated based on the information. According to another embodiment, the specified signal may include information for changing the angle of the reflecting plate 415 or the position of the reflecting plate 415, at a specified time interval. The reflecting plate driving unit 416 may change the angle or the position of the reflecting plate 415 based on the received signal.

Figure 5A:
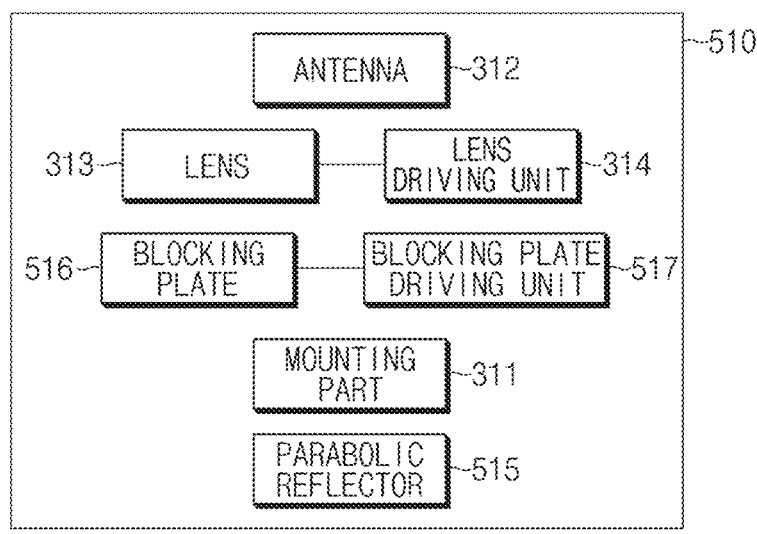
FIG. 5A illustrates a block diagram of an antenna chamber, according to another embodiment.
Figure 5B:
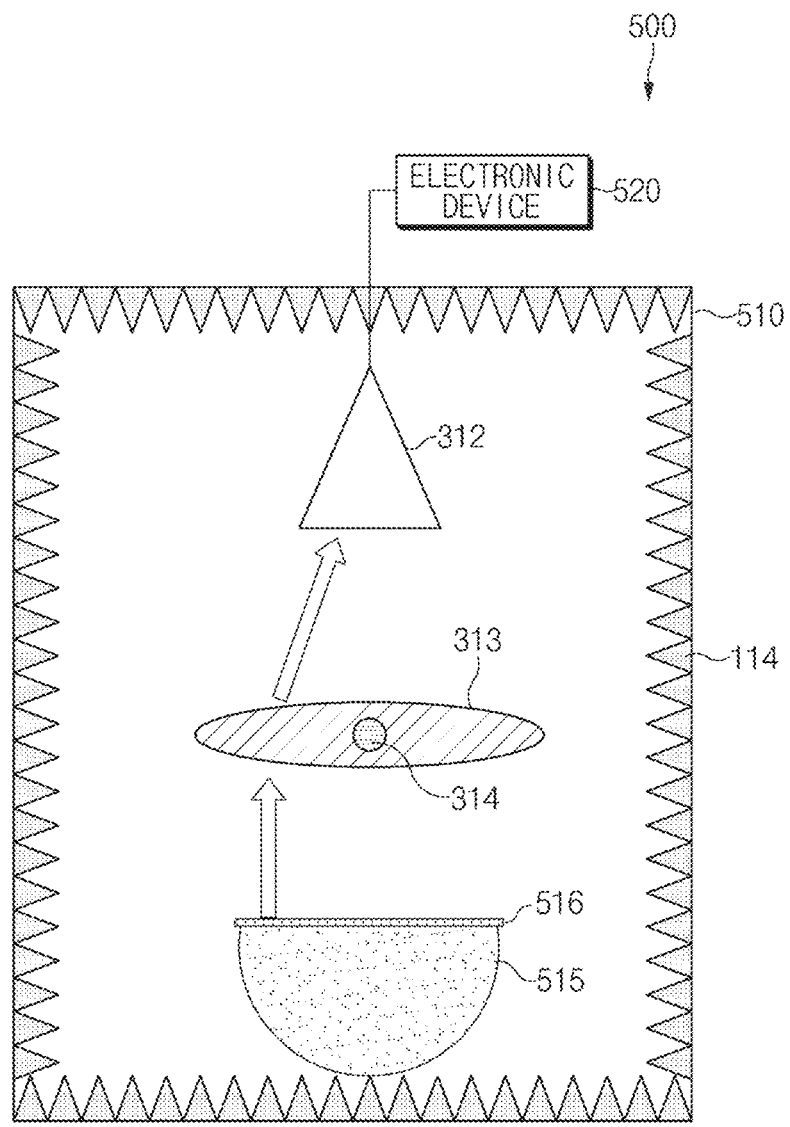
FIG. 5B illustrates a system for measuring antenna performance, which includes an antenna chamber, according to another embodiment.
Figure 5C:
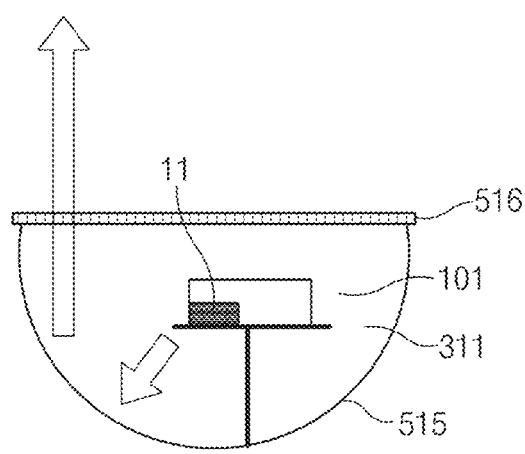
FIG. 5C is a sectional view of a parabolic reflector, which is included in an antenna chamber, taken in a direction perpendicular to a blocking plate, according to another embodiment.
Figure 5D:
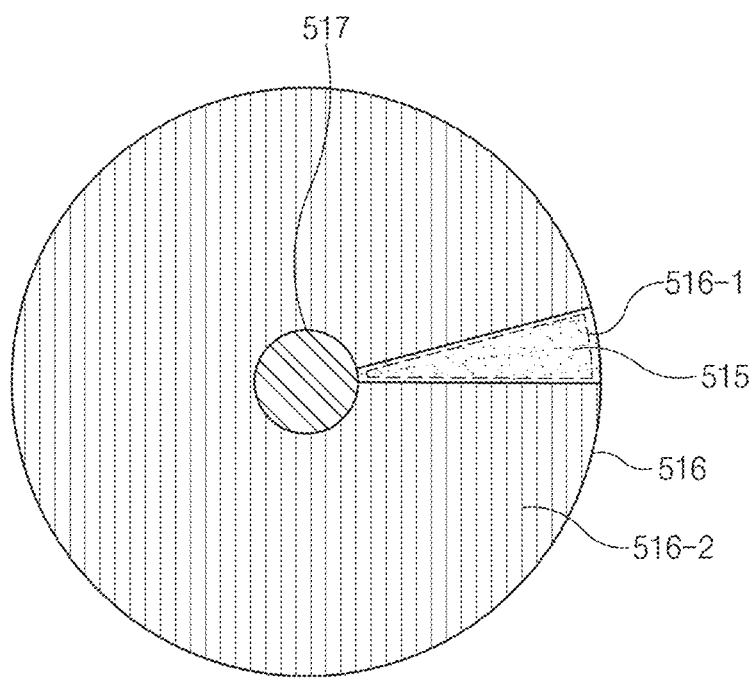
FIG. 5D illustrates a plan view of a parabolic reflector included in an antenna chamber, according to another embodiment.

FIG. 5A illustrates a block diagram of an antenna chamber, according to another embodiment. FIG. 5B illustrates a system for measuring antenna performance, which includes an antenna chamber according to another embodiment. FIG. 5C is a sectional view of a parabolic reflector, which is included in an antenna chamber, taken in a direction perpendicular to a blocking plate, according to another embodiment. FIG. 5D illustrates a plan view of a parabolic reflector included in an antenna chamber, according to another embodiment.

Referring to FIG. 5A, an antenna chamber 510 (e.g., the antenna chamber (510) 110 of FIG. 2A or 2B) may include the mounting part 311, the antenna 312, the lens 313, the lens driving unit 314, a parabolic reflector 515, a blocking plate 516, and a blocking plate driving unit 517. According to various embodiments, the antenna chamber 510 may additionally include a component not illustrated in FIG. 5A, and may not include some of components illustrated in FIG. 5A. In the following description made with reference to FIG. 5A, the same as or similar to those of the description made with reference to FIG. 3A will be omitted to avoid redundancy.

The parabolic reflector 515 may be a reflecting plate formed in a parabolic shape. A signal radiated from an antenna module of the external electronic device 101, which is disposed at a focal point of the parabolic surface, toward the parabolic surface may be reflected in a direction parallel to an axis of the parabolic surface. In addition, a signal incident in parallel to the axis of the parabolic surface may be reflected from the parabolic surface, essentially may pass the focal point, and may be detected by the antenna module of the external electronic device 101, which is disposed at the focal point. According to various embodiments, the reflector plate 515 may include silver, copper, or aluminum.

According to an embodiment, as illustrated in FIG. 5C, the mounting part 311 may be disposed such that the antenna area 11 of the external electronic device 101 is positioned at the focal point of the parabolic reflector 515, and the external electronic device 101 may be mounted on the mounting part 311 such that the antenna area 11 faces the parabolic reflector 515. In other words, the external electronic device 101 may be disposed on the mounting part 311 such that the antenna area 11 of the external electronic device 101 to radiate the millimeter wave signal, for example, the antenna area 11 including at least one antenna faces the parabolic reflector 515 at the focal point of the parabolic reflector 515. According to an embodiment, the parabolic reflector 515 may reflect the millimeter wave signal radiated from the external electronic device 101 in parallel to the axis of the parabolic surface.

The blocking plate 516 is interposed between the parabolic reflector 515 and the lens 313, and may include a first area 516-1 through which the millimeter wave signal may pass and a second area 516-2 through which the millimeter wave signal does not pass. According to an embodiment, the blocking plate 516 may pass the millimeter wave signal in the direction of the lens 313 when the millimeter wave signal reflected from the parabolic reflector 515 is incident into the first area 516-1. According to an embodiment, the blocking plate 516 may block the millimeter wave signal when the millimeter wave signal reflected from the parabolic reflector 515 is incident into the second area 516-2. In this case, the millimeter wave signal may not arrive at the lens 313.

According to various embodiments, the blocking plate 516 may contribute to determining whether the millimeter wave signal is radiated in a specified direction from the external electronic device 101. For example, in the blocking plate 516, the position of the first area 516-1 may be controlled by the blocking plate driving unit 517. When the external electronic device 101 radiates the millimeter wave signal in the first direction, which is preset, the millimeter wave signal may pass toward the lens 313 through the first area 516-1. When the external electronic device 101 radiates the millimeter wave signal in a direction different from the first direction, which is preset, the millimeter wave signal may be blocked by the second area 516-2. When the millimeter wave signal is blocked, the antenna 312 may not detect the millimeter wave signal, and an electronic device 520 may determine that the external electronic device 101 fails to radiate a signal in the specified direction.

The blocking plate driving unit 517 may rotate the blocking plate 516 such that the position of the first area 516-1 and the position of the second area 516-2 are changed. According to an embodiment, the blocking plate driving unit 517 may rotate the blocking plate 516 based on the set direction, so-called, first direction, of the millimeter wave signal radiated from the external electronic device 101. For example, the blocking plate driving unit 517 may rotate the blocking plate 516 such that the first area 516-1 of the blocking plate 516 is positioned at an area corresponding to at least the first direction. In one embodiment, the area corresponding to the first direction may be understood as an area in which the signal radiated in the first direction toward the parabolic surface from the focal point of the parabolic surface is reflected in a direction parallel to the axis of the parabolic surface to cross the blocking plate 516.

According to an embodiment, the blocking plate driving unit 517 may rotate the blocking plate 516 based on the first direction, which is set, regardless of the direction in which the millimeter wave signal is actually radiated from the external electronic device 101. For example, the blocking plate driving unit 517 may rotate the blocking plate 516 such that the first area 516-1 of the blocking plate 516 is positioned at the area corresponding to the first direction on the assumption that the millimeter wave signal is exactly incident in the first direction, which is set, from the external electronic device 101.

Referring to FIG. 5B, the antenna chamber 510 illustrated in FIG. 5A may constitute a system 500 for measuring antenna performance together with the electronic device 520. The electronic device 520 may be, for example, the electronic device 120 illustrated in FIG. 2A or may include the control device 121 and the measuring device 122 illustrated in FIG. 2B. In the following description made with reference to FIG. 5B, the same as or similar to those of the description made with reference to FIG. 3B will be omitted to avoid redundancy.

According to an embodiment, the electronic device 520 may make communication with the blocking plate driving unit 517 wiredly or wirelessly, and may transmit a specified signal to the blocking plate driving unit 517. In an embodiment, the specified signal may include information on the first direction set for radiation of a millimeter wave signal from the external electronic device 101 or position information on the first area 516-1 of the blocking plate 516 determined based on the information on the first direction. According to another embodiment, the specified signal may include information for rotating the blocking plate 516 at a specified time interval. The blocking plate driving unit 517 may rotate the blocking plate 516 based on the received signal and may change the position of the first area 516-1 of the blocking plate 516.

According to an embodiment, when the antenna chamber 510 includes the parabolic reflector 515, the electronic device 520 may control the lens driving unit 314 to constantly maintain an angle of the lens 313. The parabolic reflector 515 always reflects the millimeter wave signal, which is radiated from the focal point, in parallel to the axis of the parabolic surface, so the angle formed between the millimeter wave signal and the lens 313 may be constant. Accordingly, the electronic device 520 may transmit a specified signal to the lens driving unit 314 and may control the lens driving unit 314 such that the lens 313 is in a basic state, for example, is not inclined. According to an embodiment, when the antenna chamber 510 includes the parabolic reflector 515, the angle of the lens 313 may be constantly maintained, and the lens driving unit 314 to adjust the angle of the lens 313 may be omitted.

Referring to FIGS. 5C and 5D, a sectional view and a plan view of the parabolic reflector 515 are illustrated. For example, FIG. 5C may be a side view of a parabolic reflector taken perpendicularly to the blocking plate 516, and FIG. 5D may be a plan view of the parabolic reflector 515 when viewed from the top of the blocking plate 516. According to an embodiment, the blocking plate 516 may be disposed in a direction of facing the parabolic reflector 515. The mounting part 311 may be disposed to mount the external electronic device 101, inside an area surrounded by the parabolic reflector 515 and the blocking plate 516. The mounting part 311 may be disposed at a specified position such that the area 11, in which the antenna of the external electronic device 101 is disposed, may be positioned at the focal point of the parabolic surface.

The blocking plate 516 may be open only in a partial area such that the millimeter wave signal is blocked from the remaining areas except for the partial area. In one embodiment, the open area may be referred to as the first area 516-1 through which the millimeter wave signal may pass, and the remaining area is the second area 516-2 through which a millimeter wave signal may not pass.

According to an embodiment, the blocking plate driving unit 517 to rotate the blocking plate 516 may be positioned at the central portion of the blocking plate 516. The blocking plate driving unit 517 may rotate the blocking plate 516 such that the first area 516-1 of the blocking plate 516 is positioned at the area at least corresponding to the first direction set for the radiation of the millimeter wave signal from the external electronic device 101.

Figure 6A:
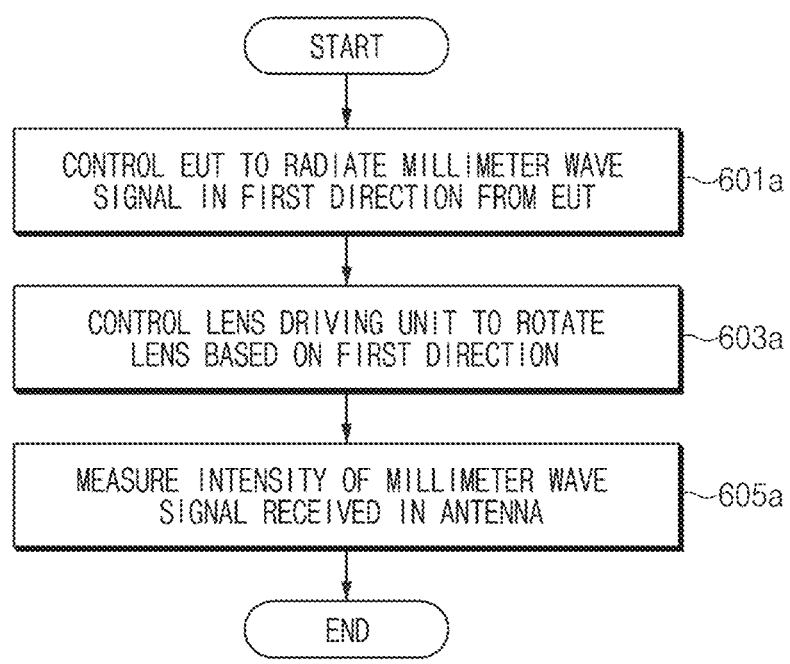
FIG. 6A illustrates a flowchart of measuring antenna performance of an external electronic device by a system for measuring the antenna performance, according to an embodiment.

FIG. 6A illustrates a flowchart of measuring antenna performance of an external electronic device by a system for measuring antenna performance, according to an embodiment.

Referring to FIG. 6A, a method of measuring antenna performance of an external electronic device (e.g., the external electronic device 101 of FIG. 1) by a system (e.g., the system 300 for measuring antenna performance of FIG. 3B) for measuring the antenna performance may include operation 601a to operation 605a. According to an embodiment, operation 601a to operation 605a may be understood as being performed by an electronic device (e.g., the electronic device 120 of FIG. 1).

In operation 601a, the electronic device may control the external electronic device to radiate a millimeter wave signal in a first direction. For example, the electronic device may make communication with the external electronic device and may transmit a specified signal including information on the first direction to the external electronic device. The external electronic device may be configured to receive the specified signal and to radiate the millimeter wave signal in the first direction, based on the received signal.

In operation 603a, the electronic device may control a lens driving unit (e.g., the lens driving unit 314 of FIG. 3A) to rotate a lens (e.g., the lens 313 of FIG. 3A) based on the first direction set for the radiation of the millimeter wave signal from the external electronic device. For example, the electronic device may make communication with the lens driving unit and transmit the specified signal including the information on the first direction or information on a specified angle of the lens corresponding to the first direction to the lens driving unit.

According to various embodiments, operation 601a to operation 603a may be performed in parallel to each other, which differs from that illustrated in FIG. 6A. Alternatively, operation 603a may be first performed and then operation 601a may be performed.

In operation 605a, the electronic device may measure the intensity of the millimeter wave signal received from an antenna (e.g., the antenna 312 of FIG. 3A). According to an embodiment, the antenna performance of the external electronic device may be determined based on the intensity of the measured millimeter wave signal. For example, when the specified intensity is in the specified level or more, the millimeter wave signal may be determined as being exactly radiated in the specified direction. The beamforming performance of the external electronic device 101 may be determined as being in the specified level or more. For another example, when the measured intensity is in less than the specified level, the millimeter wave signal may not be determined as being exactly radiated, and the beamforming performance of the external electronic device 101 may be determined as being in less than the specified level.

Figure 6B:
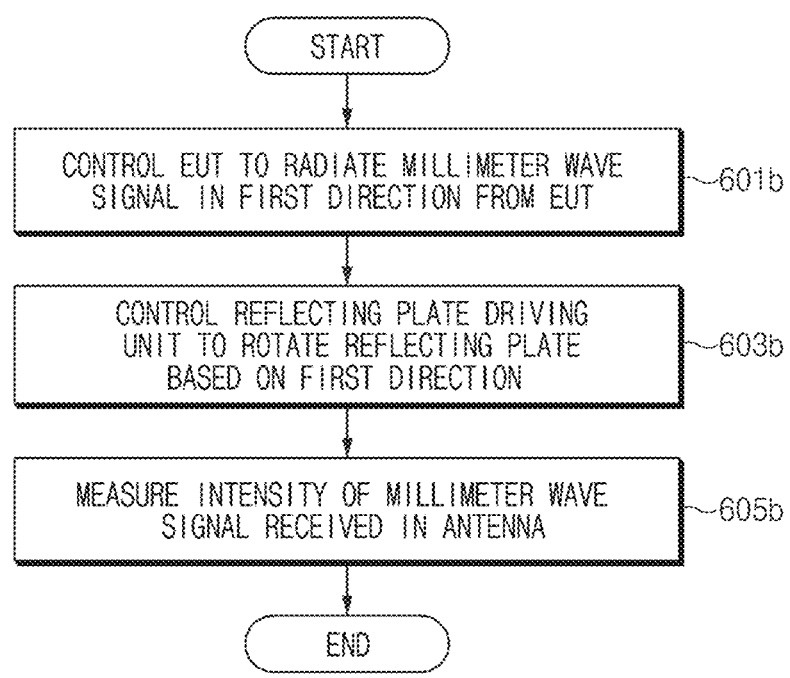
FIG. 6B illustrates a flowchart of measuring antenna performance of an external electronic device by a system for measuring antenna performance, according to another embodiment.

FIG. 6B illustrates a flowchart of measuring antenna performance of an external electronic device by a system for measuring the antenna performance, according to another embodiment.

Referring to FIG. 6B, a method of measuring antenna performance of an external electronic device (e.g., the external electronic device 101 of FIG. 1) by a system (e.g., the system 400 for measuring antenna performance of FIG. 4B) for measuring the antenna performance may include operation 601b to operation 605b. According to an embodiment, operation 601b to operation 605b may be understood as being performed by an electronic device (e.g., the electronic device 120 of FIG. 1). In the following description made with reference to FIG. 6B, the same as or similar to those of the description made with reference to FIG. 6A will be omitted to avoid redundancy. For example, operation 601b and operation 605b may be the same as or similar to operation 601a and operation 605a illustrated in FIG. 6A.

In operation 603b, the electronic device may control a reflecting plate driving unit (e.g., the reflecting plate driving unit 416 of FIG. 4B) to rotate a reflecting plate (e.g., the reflecting plate 415 of FIG. 4A) based on the first direction set for the radiation of the millimeter wave signal from the external electronic device. For example, the electronic device may make communication with the reflecting plate driving unit and transmit the specified signal including the information on the first direction or information on a specified angle of the reflecting plate corresponding to the first direction to the reflecting plate driving unit.

According to an embodiment, when the first direction is out of a tolerance range for the change of the direction toward an antenna (e.g., the antenna 312 of FIG. 4A) through the lens (e.g., the lens 313 of FIG. 4A), the electronic device may control the lens driving unit (e.g., the lens driving unit 314 of FIG. 4A) such that the lens is in a basic state, for example, is not inclined.

Figure 6C:
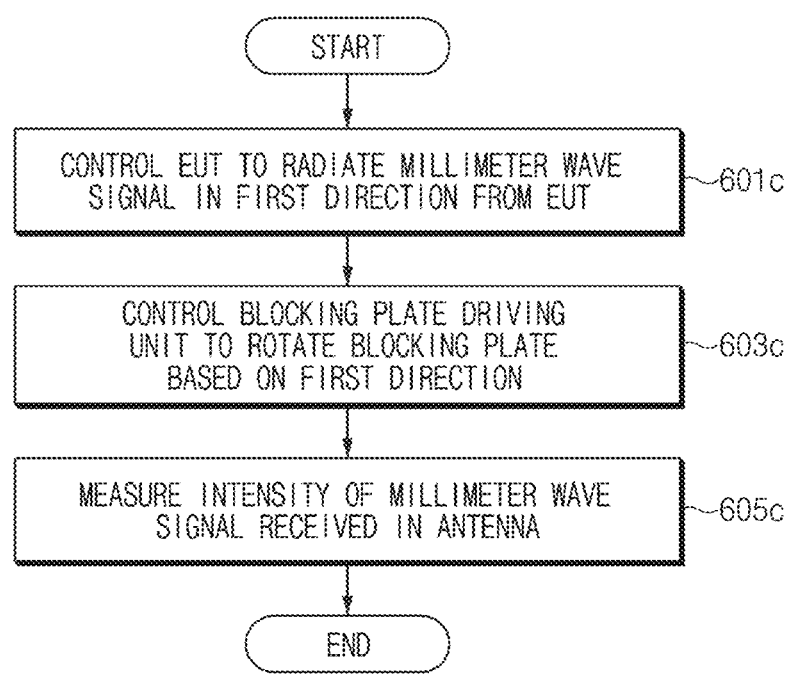
FIG. 6C illustrates a flowchart of measuring antenna performance of an external electronic device by a system for measuring antenna performance, according to another embodiment.

FIG. 6C illustrates a flowchart of measuring antenna performance of an external electronic device by a system for measuring antenna performance, according to another embodiment.

Referring to FIG. 6C, a method of measuring antenna performance of an external electronic device (e.g., the external electronic device 101 of FIG. 1) by a system (e.g., the system 500 for measuring antenna performance of FIG. 5B) for measuring the antenna performance may include operation 601c to operation 605c. According to an embodiment, operation 601c to operation 605c may be understood as being performed by an electronic device (e.g., the electronic device 120 of FIG. 1). In the following description made with reference to FIG. 6C, the same as or similar to those of the description made with reference to FIG. 6A will be omitted to avoid redundancy. For example, operation 601c and operation 605c may be the same as or similar to operation 601a and operation 605a illustrated in FIG. 6A.

In operation 603c, the electronic device may control a blocking plate driving unit (e.g., the blocking plate driving unit 517 of FIG. 5A) to rotate a blocking plate (e.g., the blocking plate 516 of FIG. 5A) based on the first direction set for the radiation of the millimeter wave signal from the external electronic device. For example, the electronic device may make communication with the blocking plate driving unit and transmit the specified signal including the information on the first direction or information on a first area of the blocking plate corresponding to the first direction to the blocking plate driving unit. The blocking plate driving unit may perform a control operation based on the specified signal such that the first area of the blocking plate is positioned at an area corresponding to the first direction.

According to an embodiment, the electronic device may control the lens driving unit (e.g., the lens driving unit 314 of FIG. 5A) such that the lens (e.g., the lens 313 of FIG. 5A) is in the basic state, for example, is not inclined.

Figure 7:
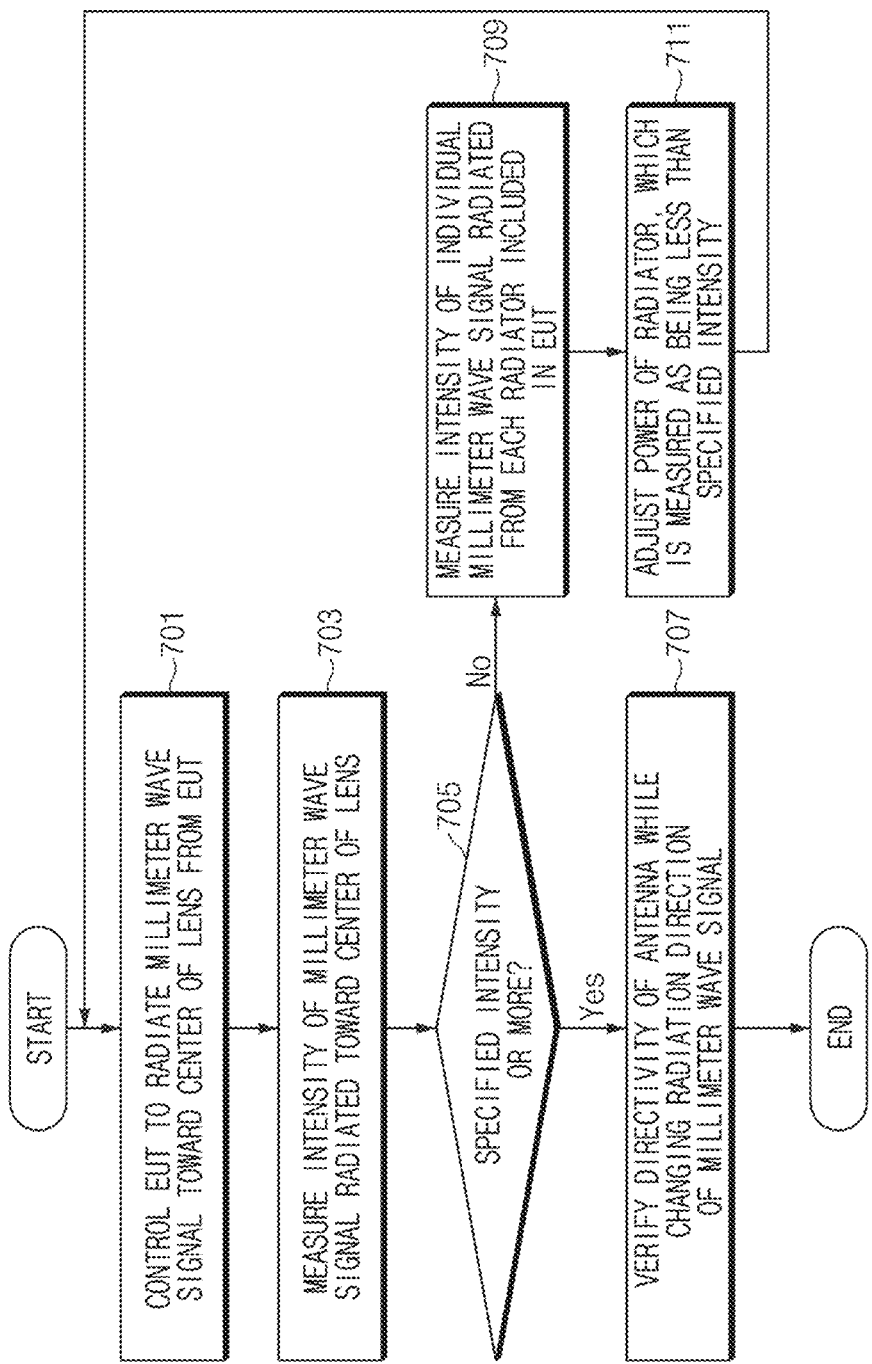
FIG. 7 illustrates a flowchart of measuring antenna performance of an external electronic device by a system for measuring antenna performance, according to another embodiment.

FIG. 7 illustrates a flowchart of measuring antenna performance of an external electronic device by a system for measuring the antenna performance, according to another embodiment.

Referring to FIG. 7, a method of measuring antenna performance of an external electronic device (e.g., the external electronic device 101 of FIG. 1) by a system (e.g., the system 300 for measuring antenna performance of FIG. 3B) for measuring the antenna performance may include operation 701 to operation 711. According to an embodiment, operation 701 to operation 711 may be understood as being performed by an electronic device (e.g., the electronic device 120 of FIG. 1).

In operation 701, the electronic device may control the external electronic device to radiate a millimeter wave signal toward the center of the lens. The electronic device may make communication with the external electronic device and may transmit a specified signal to the external electronic device. The external electronic device may be configured to receive the specified signal and to radiate the millimeter wave signal toward the center of the lens, based on the received signal. Operation 701 may be an operation of determining basic output of an antenna before measuring beamforming performance of the external electronic device.

In operation 703, the electronic device may measure the intensity of the millimeter wave signal radiated toward the center of the lens. For example, the millimeter wave signal radiated from the external electronic device and passing through the lens may be detected or received by the antenna, and the electronic device electrically connected with the antenna may measure the intensity of the millimeter wave signal.

In operation 705, the electronic device may determine the intensity of the millimeter wave signal, which is measured in operation 703, is a specified intensity or more. In an embodiment, when the measured intensity of the millimeter wave signal is the specified intensity or more, the basic output of the antenna included in the external electronic device may be not determined as being abnormal. The electronic device may perform operation 707 to identify the beamforming performance of the external electronic device. In an embodiment, when the measured intensity of the millimeter wave signal is less than the specified intensity, the basic output of the antenna included in the external electronic device may be determined as being abnormal, and operation 709 may be performed.

In operation 707, the electronic device may verify the directivity of the antenna while changing the radiation direction of the millimeter wave signal. In operation 707, the electronic device may repeat operation 601a to 605a illustrated in FIG. 6A, operation 601b to 605b illustrated in FIG. 6B, or operation 601c to 605c illustrated in FIG. 6C.

For example, the electronic device may perform operations 601a to 605a with respect to the first direction, and may perform operations 601a to 605a with respect to the second direction different from the first direction. According to an embodiment, the electronic device may perform operation 601a to operation 605a while changing the direction set for a millimeter wave signal radiated from an external electronic device at a specified time interval. The above description will be identically or similarly applied to operation 601b to operation 605b or operation 601c to operation 605c.

The user may determine whether the external electronic device may exactly perform beamforming with respect to various directions through operation 707.

In operation 709, the electronic device may measure the intensity of an individual millimeter wave signal radiated from each radiator included in the external electronic device. When the basic output of the antenna is determined as being abnormal in operation 705, the electronic device may perform an operation of determining a radiator showing an abnormal output instead of performing a test for beamforming performance. For example, the electronic device may determine the radiator showing the abnormal output by controlling at least some of a plurality of radiators.

In operation 711, the electronic device may adjust power of a radiator, which is measured as being less than a specified intensity in operation 709. According to an embodiment, the electronic device may perform operation 701 again after performing operation 711.

Figure 8:
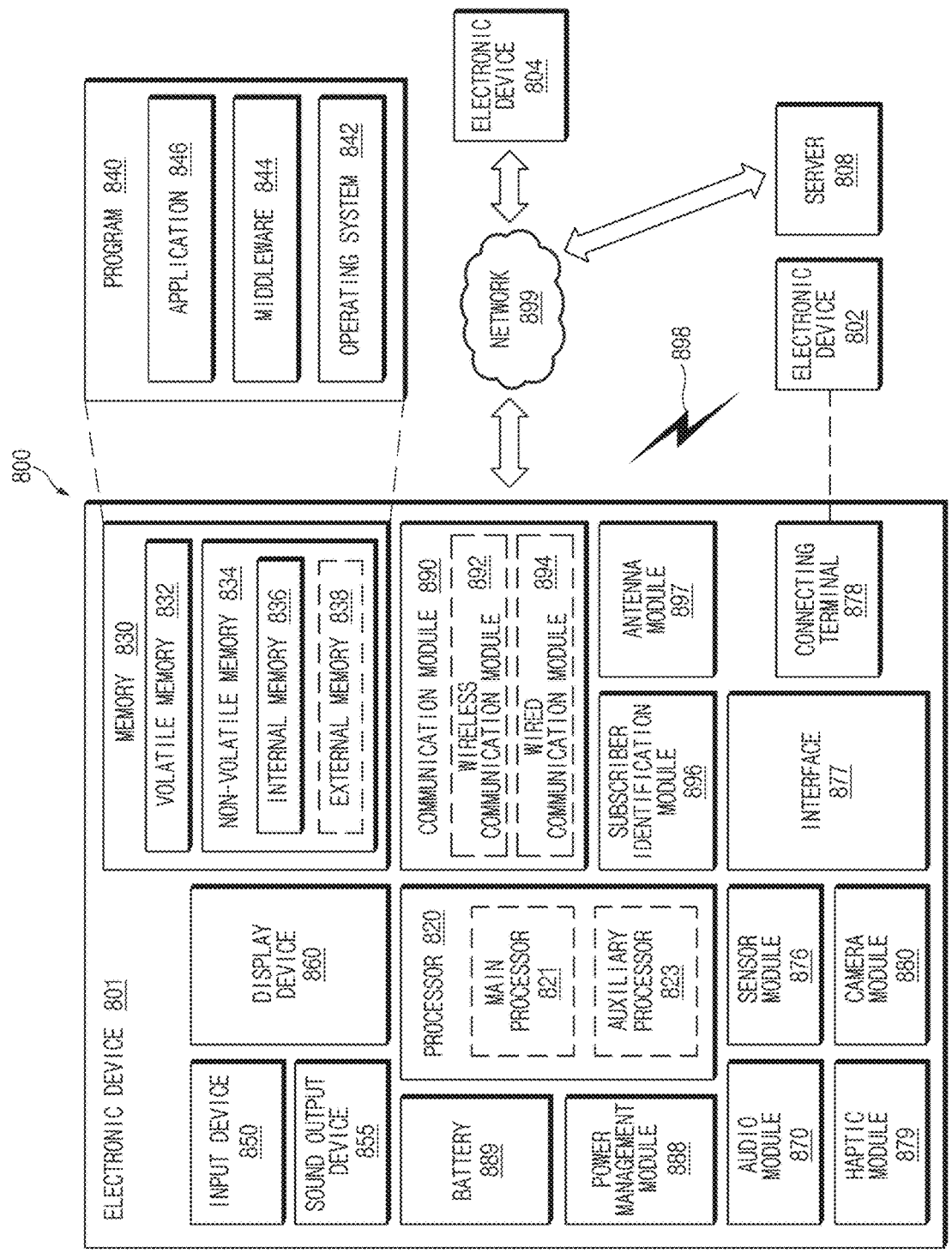
FIG. 8 is a block diagram illustrating an electronic device under a network environment, according to various embodiments.

FIG. 8 is a block diagram illustrating an electronic device 801 in a network environment 800 according to various embodiments. Referring to FIG. 8, the electronic device 801 in the network environment 800 may communicate with an electronic device 802 via a first network 898 (e.g., a short-range wireless communication network), or an electronic device 804 or a server 808 via a second network 899 (e.g., a long-range wireless communication network). According to an embodiment, the electronic device 801 may communicate with the electronic device 804 via the server 808.

According to an embodiment, the electronic device 801 may include a processor 820, memory 830, an input device 850, a sound output device 855, a display device 860, an audio module 870, an sensor module 876, an interface 877, a haptic module 879, a camera module 880, a power management module 888, a battery 889, a communication module 890, a subscriber identification module (SIM) 896, or an antenna module 897. In some embodiments, at least one (e.g., the display device 860 or the camera module 880) of the components may be omitted from the electronic device 801, or one or more other components may be added in the electronic device 801. In some embodiments, some of the components may be implemented as single integrated circuitry. For example, the sensor module 876 (e.g., a fingerprint sensor, an iris sensor, or an illuminance sensor) may be implemented as embedded in the display device 860 (e.g., a display).

The processor 820 may execute, for example, software (e.g., a program 840) to control at least one other component (e.g., a hardware or software component) of the electronic device 801 coupled with the processor 820, and may perform various data processing or computation. According to one embodiment, as at least part of the data processing or computation, the processor 820 may load a command or data received from another component (e.g., the sensor module 876 or the communication module 890) in volatile memory 832, process the command or the data stored in the volatile memory 832, and store resulting data in non-volatile memory 834. According to an embodiment, the processor 820 may include a main processor 821 (e.g., a central processing unit (CPU) or an application processor (AP)), and an auxiliary processor 823 (e.g., a graphics processing unit (GPU), an image signal processor (ISP), a sensor hub processor, or a communication processor (CP)) that is operable independently from, or in conjunction with, the main processor 821. Additionally or alternatively, the auxiliary processor 823 may be adapted to consume less power than the main processor 821, or to be specific to a specified function. The auxiliary processor 823 may be implemented as separate from, or as part of the main processor 821.

The auxiliary processor 823 may control at least some of functions or states related to at least one component (e.g., the display device 860, the sensor module 876, or the communication module 890) among the components of the electronic device 801, instead of the main processor 821 while the main processor 821 is in an inactive (e.g., sleep) state, or together with the main processor 821 while the main processor 821 is in an active state (e.g., executing an application). According to an embodiment, the auxiliary processor 823 (e.g., an image signal processor or a communication processor) may be implemented as part of another component (e.g., the camera module 880 or the communication module 890) functionally related to the auxiliary processor 823.

The memory 830 may store various data used by at least one component (e.g., the processor 820 or the sensor module 876) of the electronic device 801. The various data may include, for example, software (e.g., the program 840) and input data or output data for a command related thereto. The memory 830 may include the volatile memory 832 or the non-volatile memory 834.

The program 840 may be stored in the memory 830 as software, and may include, for example, an operating system (OS) 842, middleware 844, or an application 846.

The input device 850 may receive a command or data to be used by other component (e.g., the processor 820) of the electronic device 801, from the outside (e.g., a user) of the electronic device 801. The input device 850 may include, for example, a microphone, a mouse, or a keyboard.

The sound output device 855 may output sound signals to the outside of the electronic device 801. The sound output device 855 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 860 may visually provide information to the outside (e.g., a user) of the electronic device 801. The display device 860 may include, for example, a display, a hologram device, or a projector and control circuitry to control a corresponding one of the display, hologram device, and projector. According to an embodiment, the display device 860 may include touch circuitry adapted to detect a touch, or sensor circuitry (e.g., a pressure sensor) adapted to measure the intensity of force incurred by the touch.

The audio module 870 may convert a sound into an electrical signal and vice versa. According to an embodiment, the audio module 870 may obtain the sound via the input device 850, or output the sound via the sound output device 855 or a headphone of an external electronic device (e.g., an electronic device 802) directly (e.g., wiredly) or wirelessly coupled with the electronic device 801.

The sensor module 876 may detect an operational state (e.g., power or temperature) of the electronic device 801 or an environmental state (e.g., a state of a user) external to the electronic device 801, and then generate an electrical signal or data value corresponding to the detected state. According to an embodiment, the sensor module 876 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 877 may support one or more specified protocols to be used for the electronic device 801 to be coupled with the external electronic device (e.g., the electronic device 802) directly (e.g., wiredly) or wirelessly. According to an embodiment, the interface 877 may include, for example, a high definition multimedia interface (HDMI), a universal serial bus (USB) interface, a secure digital (SD) card interface, or an audio interface.

A connecting terminal 878 may include a connector via which the electronic device 801 may be physically connected with the external electronic device (e.g., the electronic device 802). According to an embodiment, the connecting terminal 878 may include, for example, a HDMI connector, a USB connector, a SD card connector, or an audio connector (e.g., a headphone connector), The haptic module 879 may convert an electrical signal into a mechanical stimulus (e.g., a vibration or a movement) or electrical stimulus which may be recognized by a user via his tactile sensation or kinesthetic sensation. According to an embodiment, the haptic module 879 may include, for example, a motor, a piezoelectric element, or an electric stimulator.

The camera module 880 may capture a still image or moving images. According to an embodiment, the camera module 880 may include one or more lenses, image sensors, image signal processors, or flashes.

The power management module 888 may manage power supplied to the electronic device 801. According to one embodiment, the power management module 888 may be implemented as at least part of, for example, a power management integrated circuit (PMIC).

The battery 889 may supply power to at least one component of the electronic device 801. According to an embodiment, the battery 889 may include, for example, a primary cell which is not rechargeable, a secondary cell which is rechargeable, or a fuel cell.

The communication module 890 may support establishing a direct (e.g., wired) communication channel or a wireless communication channel between the electronic device 801 and the external electronic device (e.g., the electronic device 802, the electronic device 804, or the server 808) and performing communication via the established communication channel. The communication module 890 may include one or more communication processors that are operable independently from the processor 820 (e.g., the application processor (AP)) and supports a direct (e.g., wired) communication or a wireless communication. According to an embodiment, the communication module 890 may include a wireless communication module 892 (e.g., a cellular communication module, a short-range wireless communication module, or a global navigation satellite system (GNSS) communication module) or a wired communication module 894 (e.g., a local area network (LAN) communication module or a power line communication (PLC) module). A corresponding one of these communication modules may communicate with the external electronic device via the first network 898 (e.g., a short-range communication network, such as Bluetooth™, wireless-fidelity (Wi-Fi) direct, or infrared data association (IrDA)) or the second network 899 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 892 may identify and authenticate the electronic device 801 in a communication network, such as the first network 898 or the second network 899, using subscriber information (e.g., international mobile subscriber identity (IMSI)) stored in the subscriber identification module 896.

The antenna module 897 may transmit or receive a signal or power to or from the outside (e.g., the external electronic device) of the electronic device 801. According to an embodiment, the antenna module 897 may include one or more antennas, and, therefrom, at least one antenna appropriate for a communication scheme used in the communication network, such as the first network 898 or the second network 899, may be selected, for example, by the communication module 890 (e.g., the wireless communication module 892). The signal or the power may then be transmitted or received between the communication module 890 and the external electronic device via the selected at least one antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 801 and the external electronic device 804 via the server 808 coupled with the second network 899. Each of the electronic devices 802 and 804 may be a device of a same type as, or a different type, from the electronic device 801. According to an embodiment, all or some of operations to be executed at the electronic device 801 may be executed at one or more of the external electronic devices 802, 804, or 808. For example, if the electronic device 801 should perform a function or a service automatically, or in response to a request from a user or another device, the electronic device 801, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 801. The electronic device 801 may provide the outcome, with or without further processing of the outcome, as at least part of a reply to the request. To that end, a cloud computing, distributed computing, or client-server computing technology may be used, for example.

According to an embodiment of the disclosure, an antenna chamber (e.g., the antenna chamber 310 of FIG. 3A) may include a mounting part (e.g., the mounting part 311 of FIG. 3A) to receive an external electronic device (e.g., the external electronic device 101 of FIG. 1) including an antenna module including a plurality of radiators to radiate a millimeter wave signal, a lens (e.g., the lens 313 of FIG. 3A) spaced apart from the mounting part to refract the millimeter wave signal radiated from the antenna module, an antenna (e.g., the antenna 312 of FIG. 3A) spaced apart from the lens in a direction opposite to a direction of the mounting part to receive the millimeter wave signal refracted from the lens, and a lens driving unit (e.g., the lens driving unit 314 of FIG. 3A) to move the lens based at least on a first direction, which is set, such that the millimeter wave signal set to be radiated in the first direction from the external electronic device is refracted toward the antenna.

According to an embodiment, the antenna chamber (e.g., the antenna chamber 410 of FIG. 4A) may further include at least one reflecting plate (e.g., the reflecting plate 415 of FIG. 4A) interposed between the mounting part and the antenna to reflect the millimeter wave signal, which is set to be radiated in a second direction, toward the antenna. The first direction may be included in a range of a direction to form a linear line from the external electronic device to the lens, and the second direction may not be included in at least the range.

According to an embodiment, the antenna chamber (e.g., the antenna chamber 510 of FIG. 5A) may further include a parabolic reflector (e.g., the parabolic reflector 515 of FIG. 5A) to reflect the millimeter wave signal, which is set to be radiated in the first direction, toward the lens, a blocking plate (e.g., the blocking plate 516 of FIG. 5A) interposed between the parabolic reflector and the lens, and including a first area allowing the millimeter wave signal to pass, and a second area preventing the millimeter wave signal from passing, and a blocking plate driving unit (e.g., the blocking plate driving unit 517 of FIG. 5A) to rotate the blocking plate such that the first area is positioned at an area at least corresponding to the first direction. The mounting part may be disposed inside the parabolic reflector such that the antenna module of the external electronic device is positioned at a focal point of the parabolic reflector.

According to an embodiment, the external electronic device may change a first direction, in which the millimeter wave signal is radiated, at a specified time interval, and the lens driving unit may rotate the lens based at least on the first direction, which is changed, such that the millimeter wave signal faces the antenna.

According to an embodiment, the lens driving unit may include at least one adjusting rod coupled to a lens, and the lens driving unit may move a lens by rotating the at least one adjusting rod.

According to an embodiment, the antenna may be a horn antenna.

According to an embodiment of the disclosure, a system (e.g., the system 100 for measuring the antenna performance of FIG. 1) for measuring antenna performance may include an antenna chamber (e.g., the antenna chamber 110 of FIG. 2A) including a mounting part (the mounting part 311 of FIG. 3A) to dispose an external electronic device (equipment under test; the external electronic device 101 of FIG. 1), which radiates a millimeter wave signal using an antenna module including a plurality of radiators, an antenna (e.g., the antenna 312 of FIG. 3A) to receive the millimeter wave signal, a lens (e.g., the lens 313 of FIG. 3A) interposed between the mounting part and the antenna to refract the millimeter wave signal, and a lens driving unit (e.g., the lens driving unit 314 of FIG. 3A) to seat the lens on the lens driving unit and to rotate the lens at a specified angle, and at least one electronic device (e.g., the electronic device 120a of FIG. 2A) electrically connected with the external electronic device or the antenna chamber. The at least one electronic device may control the external electronic device to radiate the millimeter wave signal in a first direction, control the lens driving unit to rotate the lens based at least on the first direction such that the millimeter wave signal set to be radiated in the first direction faces the antenna, and measure an intensity of a millimeter wave signal received in the antenna.

According to an embodiment, the at least one electronic device may include a control device to make communication with the external electronic device or the antenna chamber wiredly or wirelessly and a measuring device electrically connected with the antenna. The control device may transmit a first signal to the external electronic device such that the millimeter wave signal is radiated in the first direction from the external electronic device, and transmit a second signal to the antenna chamber such that the lens rotates based at least on the first direction. The measuring device may measure the intensity of the millimeter wave signal received in the antenna.

According to an embodiment, the at least one electronic device may amplify the millimeter wave signal received in the antenna, and measure an intensity of the millimeter wave signal which is amplified.

According to an embodiment, the at least one electronic device may control the external electronic device to change the first direction at a specified time interval, control the lens driving unit to rotate the lens based at least on the first direction at the specified time interval such that the millimeter wave signal set to be radiated in the first direction faces the antenna, and measure the intensity of the millimeter wave signal received in the antenna at the specified time interval.

According to an embodiment, the at least one electronic device may control the external electronic device such that the millimeter wave signal is radiated from the external electronic device toward the center of the lens, measure an intensity of the millimeter wave signal radiated toward the center of the lens, control the external electronic device to radiate the millimeter wave signal in the first direction when the intensity of the millimeter wave signal radiated toward the center of the lens is in a specified level or more, control the lens driving unit to rotate the lens based at least on the first direction such that the millimeter wave signal set to be radiated in the first direction faces the antenna, and measure an intensity of a millimeter wave signal received in the antenna.

According to an embodiment, the at least one electronic device may control the external electronic device such that each of radiators included in the external electronic device radiates sequentially a millimeter wave signal when the intensity of the millimeter wave signal radiated toward the lens is in less than the specified level, and measure an intensity of the millimeter wave signal sequentially radiated from each of the radiators.

According to an embodiment, the first direction may be included in a range of a direction to form a linear line from the external electronic device to the lens. The antenna chamber may further include at least one reflecting plate interposed between the mounting part and the antenna, in which the at least one reflecting plate may radiate, toward the antenna, a millimeter wave signal set to be radiated in a second direction which is not included in at least the range.

According to an embodiment, the antenna chamber may further include a parabolic reflector to reflect the millimeter wave signal, which is set to be radiated in the first direction, toward the lens, a blocking plate interposed between the parabolic reflector and the lens, and including a first area allowing the millimeter wave signal to pass, and a second area preventing the millimeter wave signal from passing, and a blocking plate driving unit to rotate the blocking plate. The mounting part may be disposed inside the parabolic reflector such that the antenna module of the external electronic device is positioned at a focal point of the parabolic reflector, and the at least one electronic device may control the blocking plate driving unit such that the first area is positioned at an area at least corresponding to the first direction.

According to an embodiment, the lens driving unit may include at least one adjusting rod coupled to a lens, and the lens driving unit may rotate a lens by rotating the at least one adjusting rod.

According to an embodiment of the disclosure, a method for measuring antenna performance of an external electronic device including an antenna module including a plurality of radiators may include controlling the external electronic device to radiate a millimeter wave signal in a first direction, rotating a lens based on the first direction such that the millimeter wave signal faces an antenna, and measuring an intensity of the millimeter wave signal received in the antenna.

According to an embodiment, the measuring of the intensity of the millimeter wave signal may include amplifying the intensity of the millimeter wave signal received in the antenna and measuring the intensity of the amplified millimeter wave signal.

According to an embodiment, the controlling of the external electronic device may include controlling the external electronic device such that the first direction is changed at the specified time interval, the rotating of the lens based on the first direction may include rotating the lens based on the changed first direction at the specified time interval, and the measuring of the intensity of the millimeter wave signal may include measuring the intensity of the millimeter wave signal at the specified time interval.

According to an embodiment, the method may further include controlling the external electronic device to radiate the millimeter wave signal toward the center of the lens, and measuring the intensity of the millimeter wave signal radiated toward the center of the lens.

According to an embodiment, the method may further include controlling the external electronic device such that a radiator selected from the antenna module included in the external electronic device radiates the millimeter wave signal when the intensity of the millimeter wave signal radiated toward the center of the lens is in less than a specified level or more, and measuring the intensity of the millimeter wave signal radiated from the selected radiator.

The electronic device according to various embodiments may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 840) including one or more instructions that are stored in a storage medium (e.g., internal memory 836 or external memory 838) that is readable by a machine (e.g., the electronic device 801). For example, a processor (e.g., the processor 820) of the machine (e.g., the electronic device 801) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

The invention claimed is:

1. An antenna chamber comprising:
 a mounting part configured to receive an external electronic device including an antenna module including a plurality of radiators to radiate a millimeter wave signal;
 a lens spaced apart from the mounting part and configured to refract the millimeter wave signal radiated from the antenna module;
 an antenna spaced apart from the lens in a direction opposite to a direction of the mounting part and configured to receive the millimeter wave signal refracted from the lens;
 at least one reflecting plate interposed between the mounting part and the antenna and configured to reflect the millimeter wave signal, wherein the millimeter wave signal is set to be radiated in a second direction, toward the antenna; and
 a lens driving unit configured to move the lens based at least on a first direction, which is set, such that the millimeter wave signal set to be radiated in the first direction from the external electronic device is refracted toward the antenna, wherein the first direction is included in a range of a direction to form a linear line from the external electronic device to the lens, and
wherein the second direction is not included in at least the range.

2. The antenna chamber of claim 1, further comprising:
a parabolic reflector configured to reflect the millimeter wave signal, which is set to be radiated in the first direction, toward the lens;
a blocking plate interposed between the parabolic reflector and the lens, and including a first area allowing the millimeter wave signal to pass through the first area, and a second area preventing the millimeter wave signal from passing through the second area; and
a blocking plate driving unit configured to rotate the blocking plate such that the first area is positioned at an area at least corresponding to the first direction,
wherein the mounting part is disposed inside the parabolic reflector such that the antenna module of the external electronic device is positioned at a focal point of the parabolic reflector.

3. The antenna chamber of claim 1, wherein the external electronic device is configured to change the first direction, in which the millimeter wave signal is radiated, at a specified time interval, and
wherein the lens driving unit is configured to rotate the lens based at least on the first direction, which is changed, at a specified time interval such that the millimeter wave signal faces the antenna.

4. The antenna chamber of claim 1, wherein the lens driving unit includes at least one adjusting rod coupled to a lens, and
wherein the lens driving unit is configured to move a lens by rotating the at least one adjusting rod.

5. The antenna chamber of claim 1, wherein the antenna is a horn antenna.

6. A system for measuring antenna performance, the system comprising:
an antenna chamber including a mounting part to dispose an external electronic device, which radiates a millimeter wave signal using an antenna module including a plurality of radiators, an antenna to receive the millimeter wave signal, a lens interposed between the mounting part and the antenna to refract the millimeter wave signal, at least one reflecting plate interposed between the mounting part and the antenna, and a lens driving unit to seat the lens on the lens driving unit and to rotate the lens at a specified angle; and
at least one electronic device electrically connected with the external electronic device or the antenna chamber,
wherein the at least one electronic device is configured to:
control the external electronic device to radiate the millimeter wave signal in a first direction;
control the lens driving unit to rotate the lens based at least on the first direction such that the millimeter wave signal set to be radiated in the first direction faces the antenna; and
measure an intensity of a millimeter wave signal received in the antenna,
wherein the first direction is included in a range of a direction to form a linear line from the external electronic device to the lens, and
wherein the at least one reflecting plate reflects, toward the antenna, the millimeter wave signal set to be radiated in a second direction which is not included in at least the range.

7. The system of claim 6, wherein the at least one electronic device includes:
a control device configured to make communication with the external electronic device or the antenna chamber wiredly or wirelessly; and
a measuring device electrically connected with the antenna,
wherein the control device is configured to:
transmit a first signal to the external electronic device such that the millimeter wave signal is radiated in the first direction from the external electronic device; and
transmit a second signal to the antenna chamber such that the lens rotates based at least on the first direction, and
wherein the measuring device is configured to measure the intensity of the millimeter wave signal received in the antenna.

8. The system of claim 6, wherein the at least one electronic device is configured to:
amplify the millimeter wave signal received in the antenna; and
measure an intensity of the millimeter wave signal which is amplified.

9. The system of claim 6, wherein the at least one electronic device is configured to:
control the external electronic device to change the first direction at a specified time interval;
control the lens driving unit to rotate the lens based at least on the first direction at the specified time interval such that the millimeter wave signal set to be radiated in the first direction faces the antenna; and
measure the intensity of the millimeter wave signal received in the antenna at the specified time interval.

10. The system of claim 6, wherein the at least one electronic device is configured to:
control the external electronic device such that the millimeter wave signal is radiated from the external electronic device toward a center of the lens;
measure an intensity of the millimeter wave signal radiated toward the center of the lens;
control the external electronic device to radiate the millimeter wave signal in the first direction when the intensity of the millimeter wave signal radiated toward the center of the lens is in a specified level or more;
control the lens driving unit to rotate the lens based at least on the first direction such that the millimeter wave signal set to be radiated in the first direction faces the antenna; and
measure the intensity of the millimeter wave signal received in the antenna.

11. The system of claim 10, wherein the at least one electronic device is configured to:
control the external electronic device such that each of radiators included in the external electronic device radiates sequentially a millimeter wave signal when the intensity of the millimeter wave signal radiated toward the center of the lens is in less than the specified level; and
measure an intensity of the millimeter wave signal sequentially radiated from each of the radiators.

12. The system of claim 6, wherein the antenna chamber further includes:
a parabolic reflector configured to reflect the millimeter wave signal, which is set to be radiated in the first direction, toward the lens;
a blocking plate interposed between the parabolic reflector and the lens, and including a first area allowing the millimeter wave signal to pass through the first area, and a second area preventing the millimeter wave signal from passing through the second area; and a blocking plate driving unit to rotate the blocking plate, wherein the mounting part is disposed inside the parabolic reflector such that the antenna module of the external electronic device is positioned at a focal point of the parabolic reflector, and wherein the at least one electronic device controls the blocking plate driving unit such that the first area is positioned at an area at least corresponding to the first direction.

13. A method for measuring antenna performance of an external electronic device including an antenna module including a plurality of radiators, the method comprising:

controlling the external electronic device to radiate a millimeter wave signal in a first direction;

rotating a lens based on the first direction such that the millimeter wave signal faces an antenna;

adjusting at least one reflecting plate to reflect, toward the antenna, the millimeter wave signal set to be radiated in a second direction which is not included in the first direction; and measuring an intensity of the millimeter wave signal received in the antenna.

* * * * *